US006742275B2

United States Patent
Mayer et al.

(10) Patent No.: US 6,742,275 B2
(45) Date of Patent: Jun. 1, 2004

(54) SCALE AND POSITION MEASURING SYSTEM FOR ABSOLUTE POSITION DETERMINATION

(75) Inventors: Elmar Mayer, Nussdorf (DE); Ulrich Benner, Trostberg (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 0 days.

(21) Appl. No.: 10/345,841

(22) Filed: Jan. 16, 2003

(65) Prior Publication Data

US 2003/0145479 A1 Aug. 7, 2003

(30) Foreign Application Priority Data

Jan. 17, 2002 (DE) .......................................... 102 01 496

(51) Int. Cl.$^7$ ................................................. G01B 5/00
(52) U.S. Cl. .............................. 33/707; 33/706; 33/1 PT
(58) Field of Search ....................... 33/707, 706, 1 PT, 33/762, 763

(56) References Cited

U.S. PATENT DOCUMENTS

| 4,774,494 A | | 9/1988 | Extance et al. |
| 5,062,214 A | * | 11/1991 | Gustafsson et al. ........... 33/706 |
| 5,519,393 A | | 5/1996 | Brandestini |
| 5,651,187 A | * | 7/1997 | Affa ............................ 33/706 |
| 5,739,775 A | | 4/1998 | Brandestini |
| 5,751,230 A | | 5/1998 | Brandestini |
| 5,880,683 A | | 3/1999 | Brandestini |
| 6,029,118 A | * | 2/2000 | Strasser ....................... 33/707 |
| 6,108,920 A | * | 8/2000 | Kinoshita .................... 33/707 |
| 6,497,049 B1 | * | 12/2002 | Holzapfel et al. ............ 33/707 |
| 6,541,761 B1 | * | 4/2003 | Holzapfel et al. ............ 33/707 |
| 2002/0066201 A1 | * | 6/2002 | Bodge et al. ................. 33/706 |
| 2002/0144423 A1 | * | 10/2002 | Rodi ............................ 33/707 |

FOREIGN PATENT DOCUMENTS

| EP | 0 635 700 A1 | 1/1995 |
| GB | 2 297 840 A | 8/1996 |

OTHER PUBLICATIONS

J.T.M. Stevenson et al., "Absolute Position Measurement using Optical Detection of Coded Patterns," Journal of Physics E/Scientific Instruments vol. 21, No. 12, (Dec., 1988) pp. 1140–1145.

* cited by examiner

Primary Examiner—Christopher W. Fulton
Assistant Examiner—Amanda J Hoolahan
(74) Attorney, Agent, or Firm—Brinks Hofer Gilson & Lione

(57) ABSTRACT

A scale which is suitable for an absolute position determination, the scale includes a track which extends in at least one measuring direction and in which graduation areas of identical width and different optical properties are alternatingly arranged. At least first, second and third graduation areas with different optical properties that are arranged in the track, wherein a first logical signal is unequivocally assigned to a first combination of two successive different graduation areas, and a second logical signal is unequivocally assigned to a second combination of two successive different graduation areas, and wherein the first and second combinations differ from each other.

21 Claims, 6 Drawing Sheets

SCALE AND POSITION MEASURING SYSTEM FOR ABSOLUTE POSITION DETERMINATION

Applicants claim, under 35 U.S.C. § 119, the benefit of priority of the filing date of Jan. 17, 2002 of a German Patent Application, Serial Number 102 01 496.5, filed on the aforementioned date, the entire contents of which is incorporated herein by reference.

BACKGROUND OF THE INVENTION

1. Field of the Invention

The present invention relates to a scale which is suitable for an absolute position determination, including a track which extends in at least one measuring direction and in which graduation areas of identical width and different optical properties are alternatingly arranged, and a first and second logical signal is unequivocally assigned to the preset sequence of two successive graduation areas. The present invention furthermore relates to a position measuring system for an absolute position determination including a scale, as well as a scanning unit, which is movable in the measuring direction for determining the absolute position of the scanning unit in relation to the scale by scanning the scale.

2. Discussion of Related Art

Incremental position measuring systems are known for determining the position of two objects which can be moved in relation to each other and which detect the relative movements of the objects in relation to each other in defined measuring steps, or increments. As a rule, the incremental position measuring systems employed for this purpose include a scale with a track in an incremental measuring graduation, which is connected with one of the two objects, as well as a scanning unit, which is connected with the other of the two objects. Displacement-dependent periodic incremental signals are generated in a known manner by optical, magnetic, inductive or capacitive scanning.

Besides this, so-called absolute position measuring systems are known, which include a track with a sequential code of several bit words on the part of the scale, which for example are designed as a pseudo random code, and from the scanning of which the absolute position along the respective measuring path can be determined. Here, the respective sequential code in the measuring direction includes an appropriate selected sequence of logical signals, or bits, which assume the values ZERO (0) and ONE (1), for example. For increasing the detection dependability in connection with such systems it is now known to derive each individual logical signal, or bit of a bit word, from a predetermined sequence of two graduation areas of different optical properties. For example, the logical signal ZERO (0) corresponds to the sequence of a transparent and a non-transparent graduation area, but the logical signal ONE (1) corresponds to the sequence of a non-transparent and a transparent graduation area in the track. Such a coding is called Manchester coding, in connection with this, reference is made to FIG. 1 in the publication "Absolute Position Measurement Using Optical Detection of Coded Patterns" by J. T. M. Stevenson and J. R. Jordan, in the J. Phys. E. Sci. Instrum. 21 (1988), pp. 1140 to 1145.

Two typical problem areas result when using such Manchester codings in absolute position measuring systems.

Initially, it must be assured in principle that the graduation areas are correctly read out, or that the detector elements used for this are correctly selected in order to assign the correct logical signal, or the correct bit value ZERO (0) or ONE (1), to a defined sequence of two graduation areas. The above mentioned publication does not provide any further suggestions in this regard.

Furthermore, the absolute position information generated by the Manchester coding is not sufficiently fine with respect to resolution. This means that as a rule provisions are made to combine the absolute position information with position information from a finer resolving incremental position measurement. For creating a higher resolving position information from a roughly resolving absolute code information, which can be combined with the incremental position measurement, initially the transitions between different graduation areas, and therefore a rough position within the respective code word, are determined in the just scanned code word by an edge interpolation, with which the incremental information is then combined. Such a process is also proposed in the above mentioned publication. It has been shown to be problematic in this case that the resultant accuracy of such an edge interpolation is negatively affected by diffraction effects, as well as the possibly existing divergence of the light source, so that errors in the position determination can result. This is the case in particular when higher resolving position measuring systems are employed with narrow widths of the graduation areas.

OBJECT AND SUMMARY OF THE INVENTION

It is therefore an object of the present invention to disclose a scale for a position measuring device which is suitable for an absolute position determination, and by which a dependably readable absolute position signal of high resolution can be obtained from a single track.

This object is attained by a scale which is suitable for an absolute position determination, the scale includes a track which extends in at least one measuring direction and in which graduation areas of identical width and different optical properties are alternatingly arranged. At least first, second and third graduation areas with different optical properties that are arranged in the track, wherein a first logical signal is unequivocally assigned to a first combination of two successive different graduation areas, and a second logical signal is unequivocally assigned to a second combination of two successive different graduation areas, and wherein the first and second combinations differ from each other.

It is a further object of the present invention to disclose a position measuring system for an absolute position determination, by which a dependably readable absolute position signal of high resolution can be generated from scanning a single track.

This object is attained by a position measuring system for absolute position determination. The position measuring system includes a scale that includes a track which extends in at least one measuring direction and in which graduation areas of identical width and different optical properties are alternatingly arranged. The scale further includes at least first, second and third graduation areas with different optical properties that are arranged in the track, wherein a first logical signal is unequivocally assigned to a first combination of two successive different graduation areas, and a second logical signal is unequivocally assigned to a second combination of two successive different graduation areas, and wherein the first and second combinations differ from each other. A scanning unit, which is movable in relation to the scale in a measuring direction and determines an absolute position of the scanning unit in relation to the scale by scanning the scale.

It is now provided in accordance with the present invention to employ on the part of the scale at least three graduation areas with different optical properties in a track. In the course of this, a first logical signal is unequivocally assigned to a first combination of two successive different graduation areas, and a second logical signal is unequivocally assigned to a second combination of two successive different graduation areas. The first and second combinations differ from each other.

Thus an unequivocal coding of the just read out bit word position is assured by these steps without further information being required. Added to this is that it is also possible to assure the detection of possibly erroneously read out signals.

Because of the periodic arrangement of one of the graduation areas on the scale it is possible to assure by appropriate measures in connection with scanning that, besides the absolute position information, moreover at least one rough incremental signal can be generated and can be employed for forming a highly resolved absolute position value. In this case no edge interpolation, such as explained above, is required, i.e. it is now possible on the basis of considerations in accordance with the present invention to produce highly resolving position measuring systems.

Basically every one of the three different graduation areas can be periodically arranged on the scale, i.e. the first, as well as the second or third graduation areas.

Regarding the embodiment of the third graduation areas there are a number of options if the first and second graduation areas have complementary optical properties. For example, in a possible variation of the third graduation areas it is possible to choose an optical property which lies between the optical properties of the complementarily embodied first and second graduation areas. In a further variation the third graduation areas have a periodic structure from which an additional fine incremental signal can be derived, which is used for once more increasing the resolution of the incremental position determination.

Because of the steps in accordance with the present invention, in a possible embodiment only a single detector arrangement with several detector elements, by which all scanning signals can be generated, is required on the scanning side for generating the different scanning signals.

The present invention can of course be used in transmitted light systems, as well as in incident light systems. In the same way linear, as well as rotatory position measuring systems can be designed. The considerations on the basis of the present invention can furthermore be transferred to systems which include more than three different graduation areas on the scale side.

Further advantages, as well as details of the present invention ensue from the subsequent description of exemplary embodiments by the attached drawings.

DETAILED DESCRIPTION OF THE PREFERRED EMBODIMENTS

Figure 1:
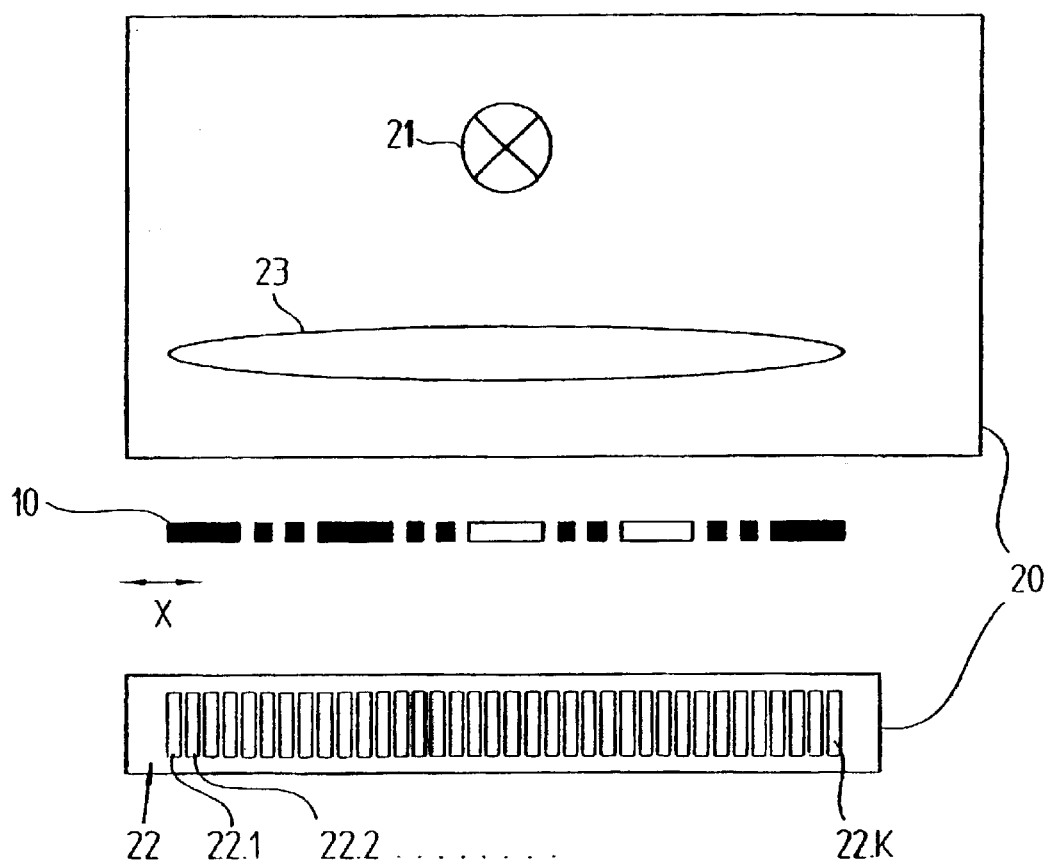
FIG. 1 is a schematic plan view of a first exemplary embodiment of a position measuring system in accordance with the invention with a first embodiment of a scanning unit and a scale in accordance with the present invention.

A first exemplary embodiment of a position measuring system in accordance with the present invention, including a first exemplary embodiment of the scale in accordance with the present invention, is represented in FIG. 1. The position measuring system, which is embodied as a linear transmitted light system, here includes a scale 10, whose actual embodiment will be explained in detail in the course of the subsequent description, as well as a scanning unit 20, which can be moved in relation to the scale 10 in at least one measurement direction x. A light source 21, an optical collimating device 23, as well as a scanning arrangement 22, consisting of a plurality k of individual detector elements 22.1, 22.2 . . . 22.k, which are arranged periodically in the measuring direction x, are arranged on the part of the scanning unit. In this case an led is considered as the light source 21, and a photodiode array with k adjoining detector elements 22.1 . . . 22.k is used as the detector arrangement 22.

The scale 10 and the scanning unit 20 of the position measuring system are connected with two objects, which can be moved with respect to each other in the measuring direction x and whose position in relation to each other is to be determined. The two objects can be, for example, a tool and a workpiece of a numerically controlled machine tool. A highly resolved absolute position information $pos_{abs}$ can be generated with the aid of the position measuring system in accordance with the present invention by photo-electric scanning of the scale 10 and the subsequent combination of the various generated scanning signals. The resultant scanning signals are an absolute position signal abs, a rough incremental signal $inc_g$, as well as a fine incremental signal $inc_f$, which will be explained in detail later. The combination of the various scanning signals into an absolute position information $pos_{abs}$ can take place directly in the position measuring system of the present invention, as well as in a downstream-connected evaluation unit, not represented, to which the various scanning signals are supplied. Such an evaluation unit could be a numerical machine tool control, for example.

Figure 2:
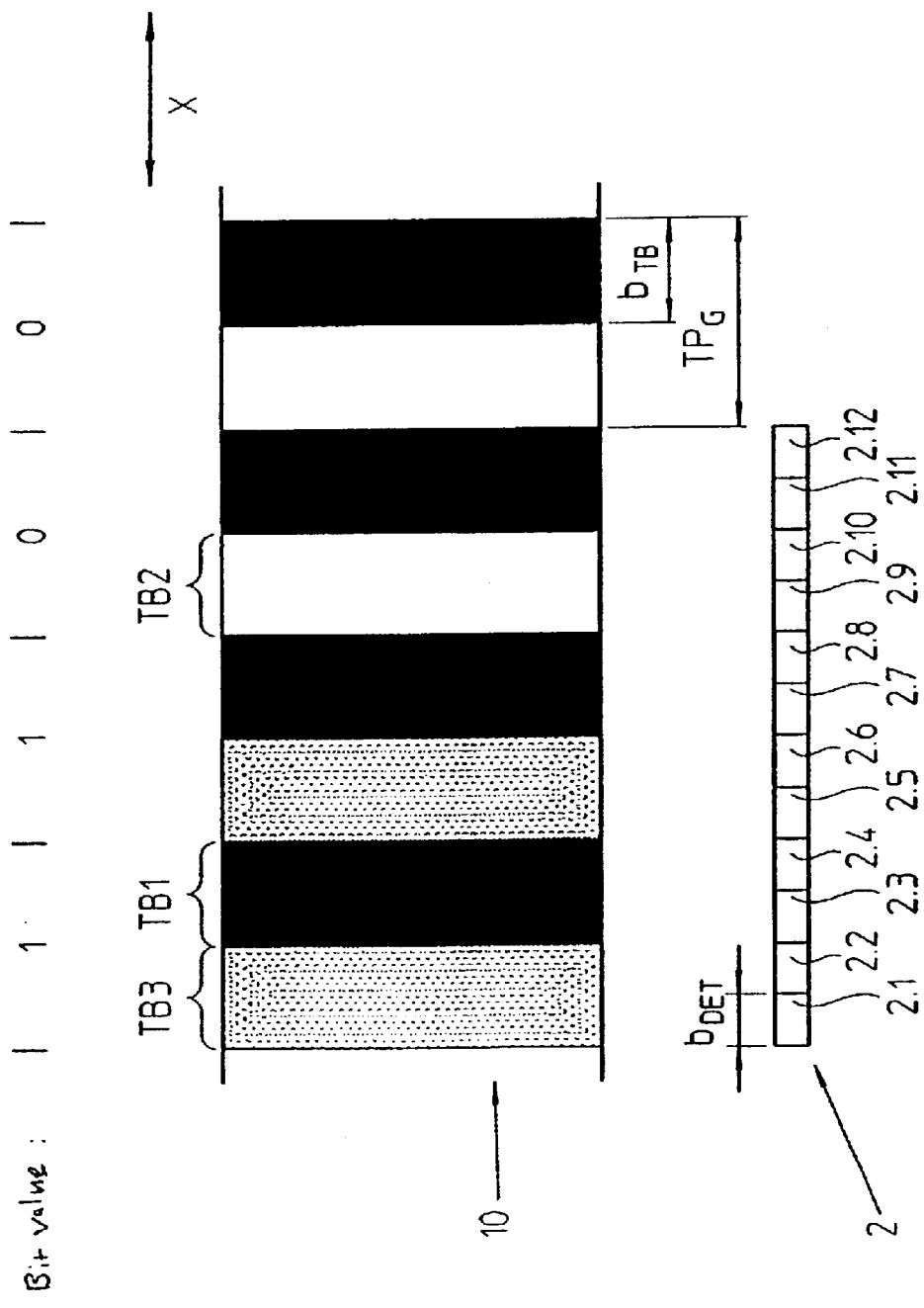
FIG. 2 is a view from above on a portion of a second embodiment of a scale in connection with a schematically embodiment of a detector arrangement in accordance with the present invention.

For the further description of an actual exemplary embodiment of the scale in accordance with the present invention, reference is now made to FIG. 2, which shows a view from above on a portion of the scale 10 in connection with a schematically indicated detector arrangement 22 suitable for scanning. As can be seen in FIG. 2, the scale 10 has first, second and third graduation areas TB1, TB2, TB3, which are arranged along the measuring direction x and all of which have the same width $b_{TB}$ in the measuring direction x, but have different optical properties. In the present example of a scale 10 for a transmitted light system, the first graduation areas TB1 are embodied to be opaque, the second graduation areas TB2 are completely transparent. A third category of graduation areas TB3 is furthermore provided on the scale in accordance with the present invention. The third graduation areas TB3 in turn have an optical property which differs from that of the first and second graduation areas TB1, TB2. In the exemplary embodiment of FIG. 2, the third graduation areas TB3 have been embodied to be semi-transparent and thus have an optical property which with respect to its optical transmission characteristics lies between the optical transmission characteristics of the first and second graduation areas TB1, TB2. The latter have optical properties which are complementary to each other because of their mentioned opaque or completely transparent embodiment.

In the example of FIG. 2, the first graduation areas TB1 are periodically arranged along the measuring direction x on the scale 10. Their period will be called a rough graduation period TPG in what follows and preferably corresponds to twice the width bTB of the graduation areas TB1, TB2, T3, i.e.

$$TP_G = 2 \cdot b_{TB} \qquad \text{Eq. (1)}$$

Basically the represented scale has a so-called Manchester coding. This essentially means that a logical signal is unequivocally assigned to each of the two different combinations of two successive different graduation areas TB3, TB1, or TB2, TB1. In the present example, the first logical signal ONE (1) is assigned to a first combination of successive third and first graduation areas TB3, TB1, the second logical signal ZERO (0) to a second combination of successive second and first graduation areas TB2, TB1. Thus, in the portion of the scale 10 represented in FIG. 1, the result, starting at the left, is the bit sequence, or the bit word, 1, 1, 0, 0, etc. as indicated, as the sequence of the different logical signals. By such a sequence of several logical signals ZERO (0) and ONE (1) it is possible to characterize in a known manner an unequivocal absolute position in the form of a code word along the scale 10 in the measuring direction x, or an absolute position signal ABS. For example, such a sequence of several logical signals can correspond to a pseudo random coding, from which a definite absolute position along the scale 10 can be derived.

In the case of the described transmitted light system, the different optical properties of the different graduation areas TP1, TB2, TB3 are different optical transparencies. In this case the first and second graduation areas TB1, TB2 have optical properties which are complementary, which in turn results in the embodiment of the first graduation area TB1 as being completely opaque, and of the second graduation area TB2 as being completely transparent. Alternatively, the explained embodiment of the graduation areas TB1, TB2 as a completely opaque graduation areas or a completely transparent graduation areas, can of course also take place in a reversal of this explained variation.

It is furthermore possible to transfer the principles of the present invention to an incident light system. This would result in the different optical properties then being different optical reflection properties of the graduation areas TB1, TB2. For example, the first graduation areas TB1 would be embodied to be non-reflecting, but the second graduation areas TB2 reflecting, or vice versa. Accordingly, the optical properties of the third graduation areas TB3 would have to be selected in such a way that they have a reflecting characteristic lying between that of the first and second graduation areas TB1, TB2 and therefore are embodied to be semi-reflecting, for example.

Moreover, within the scope of the present invention there are still further options for realizing the different optical properties of the three graduation areas TB1 to TB3. Thus, they could also have different colorations. It would furthermore be possible to embody them with periodic graduation sub-structures, each of which has different graduation properties, etc.

It is furthermore also alternatively possible to assign the logical signals ZERO (0) and ONE (1) to other combinations of the sequence of two successive graduation areas then was explained in the above example.

For scanning the scale 10 of the present invention, a detector arrangement 22 is provided on the part of the scanning unit, which includes a number of detector elements 22.1 to 22.k arranged periodically in the measuring direction x. In the present example, the detector arrangement 22 includes a total of twelve detector elements 22.1 to 22.12, each of which has a width $b_{DET} = b_{TB}/2$ in the measuring direction, which corresponds to half the width $b_{TB}$ of the graduation areas TB1 to TB3 on the scale 10.

Defined signal values, or signal levels, result on the part of the detector elements 22.1 to 22.12 for the different graduation areas TB1 to TB3 during the scanning of the scale 10, wherein for the subsequent explanation the following signal levels on the detector side are assigned to the individual graduation areas TB1 to TB3:

TB1: Signal level 0
TB2: Signal level 1
TB3: Signal level 0.5.

In the example represented in FIG. 2, therefore the detector elements 22.1, 22.2 provide the signal level 0.5, the detector elements 22.3, 22.4 the signal level 0, the detector elements 22.9, 22.10 the signal level 1, etc. Now defined logical signals ZERO (0), ONE (1) are assigned to predetermined combinations of two signal levels of different graduation areas following each other in the measuring direction x. The following assignment rules apply here:

Signal level 0.5 to signal level 0 => logical signal ONE (1) (TB3 to TB1)

Signal level 1 to signal level 0 => logical signal ZERO (0) (TB2 to TB1)

In accordance with circuit engineering, the assignment rules in this example are converted in such a way that the difference between the signal levels of adjoining graduation areas TB1 to TB3 is always generated, and the resulting difference signal DIF is unequivocally assigned in accordance with the following instructions to one of the two logical signals ZERO (0) or ONE (1):

0 < DIF < 0.75 => logical signal ONE (1)
0.75 < DIF < 1.0 => logical signal ZERO (0)

If a difference signal DIF results, which varies from the two value ranges indicated, i.e. DIF < 0, for example, this is interpreted as an error in the selection of the correct detector elements 2.1 to 2.12. Thus, the read-out of successive first and third graduation areas TB1, TB3 provides a difference signal of the value DIF = −0.5, analogous to this successive first and second graduation areas TB1, TB2 provide a difference signal of the value DIF = −1. In both cases, it is basically possible on the basis of the steps in accordance with the present invention to verify by the formation of the difference signal DIF alone and without further additional information whether the detector elements had been correctly selected.

Within the scope of the present invention, alternative rules can of course also be used in place of the explained assignment rules and instructions.

Because of the periodic arrangement of the first graduation areas TB1 with the rough graduation period $TP_G$ on the side of the scale it is moreover possible, besides the generation of absolute position signals POS in the explained manner, to also generate a periodic rough incremental signal $INC_G$. The rough incremental signal $INC_G$ has a signal period $SP_G$, which is derived in a known manner from the rough graduation period $TP_G$ of the first graduation areas TB1 on the scale 10. The rough incremental signal $INC_G$ generated in this way can be combined in a known manner with the position signal POS into a higher-resolving absolute position value $POS_{ABS}$. No further detector arrangement is required for generating the rough incremental signal $INC_G$, instead, the above explained detector arrangement 22 with the detector elements 22.1 to 22.12, periodically arranged in the measuring direction x, can also be employed for this, which are then appropriately interconnected and provide the rough incremental signal $INC_G$ at the output.

Figure 3A:
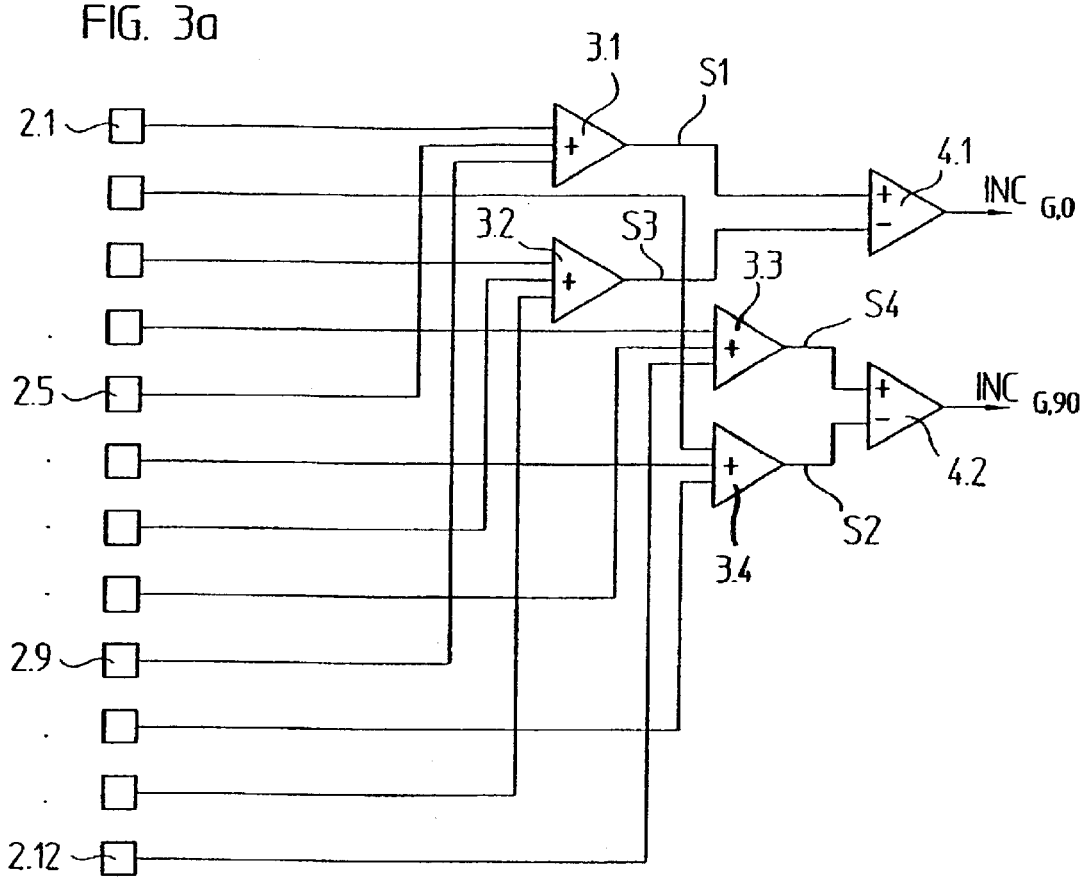
FIG. 3a is a first block circuit diagram of an embodiment of a circuit to explain the processing of the signals generated by the detector arrangement in FIG. 2 in accordance with the present invention.
Figure 3B:
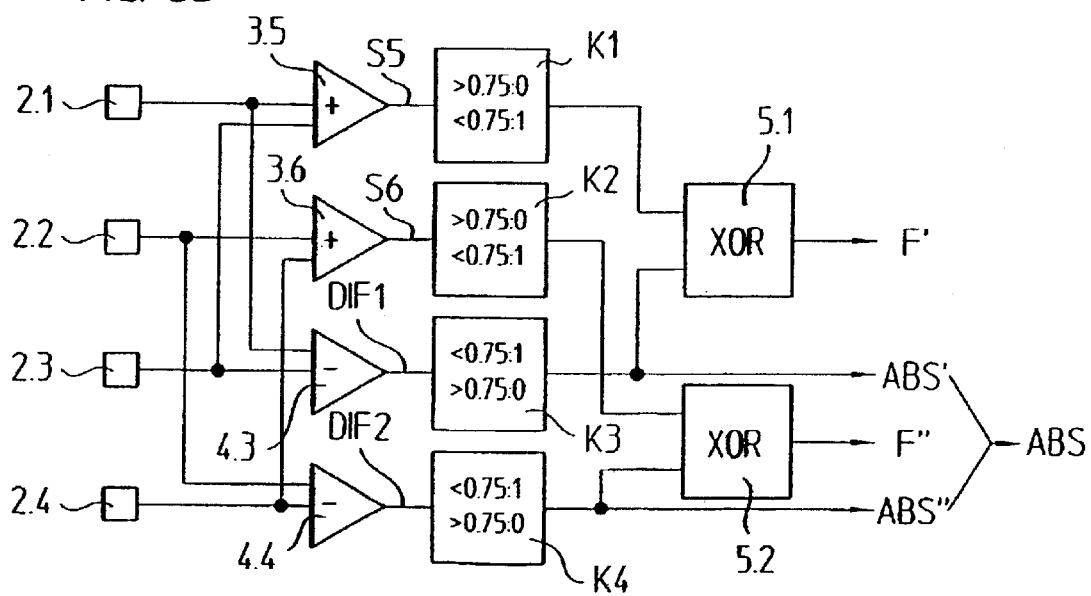
FIG. 3b is a second block circuit diagram of a second embodiment of a circuit to explain the processing of the signals generated by the detector arrangement in FIG. 2 in accordance with the present invention.

A possible interconnection variation for the detector elements 22.1 to 22.12 of the example in FIG. 2 is schematically represented in FIGS. 3A and 3B. Here, the two FIGS. 3A and 3B respectively show the required interconnection for generating the rough incremental signal $INC_G$, as well as the interconnection for generating the absolute position values $POS_{ABS}$. The representation of the interconnection variations is shown in separate drawings figures only for reasons of clarity.

Adding elements are each identified by the reference symbols 3.1 to 3.4 in FIG. 3A, which add up the scanning signals of equiphased detector elements 22.1 to 22.12 to form the sum signals S1 to S4. Difference-forming elements are identified by the reference symbols 4.1, 4.2, which in a known manner generate the two rough incremental signals $FNC_{G,0}$, or $INC_{G,90}$, which are phase shifted by 90°, from the four sum signals S1 to S4.

For generating the absolute position signal ABS, it is initially provided in accordance with FIG. 3B to feed the scanning signals from the detector elements 22.1, 22.3 to an adding element 3.5, and the scanning signals from the detector elements 22.2, 22.3 to an adding element 3.6, which provide the sum signals S5, S6 at the output. Furthermore, the generation of the difference signals DIF1, DIF2 from the scanning signals from the detector elements 22.1, 22.3, as well as 22.2, 22.4, takes place via the difference-forming elements D1, D2. Subsequently the sum and difference signals S5, S6, D1, D2 are supplied to four evaluation elements K1 to K4, which are possibly embodied as comparators with preset comparator thresholds and in which the stated assignments take place. Only the evaluation of the formed difference signals DIF1, DIF2 in accordance with the above instructions is required for generating the absolute position signal ABS. Therefore a check is performed by the two evaluation elements K3, K4 whether the respective difference signal DIF1, DIF2 is located either within the value range of 0.75<DIF1, DIF2, or within the value range of 0.75>DIF1, DIF2, as well as a check of the appropriate assignment, or output of the logical signal ONE (1) or ZERO (0) as the graduation absolute position signal ABS', ABS". Since in the present example two detector elements are arranged for each graduation area TB1 to TB3, two partial absolute position signals ABS', ABS" are generated which, if correctly read out, are further processed as the absolute position signal ABS.

For checking whether the detector elements had been correctly selected, the generation of one, or two error signals F', F" is furthermore provided in the present example. To this end the sum signals S5, S6 are evaluated in the two evaluation elements K1, K2 in accordance with the cited conditions, and thereafter the output signals provided by the evaluation elements K1, K2, together with the generated partial absolute position signals ABS', ABS" from the evaluation elements K3, K4, are fed to the linkage elements 5.1, 5.2. Following the XOR linkage performed there, the error signals F', F" result at the output, which can assume values or 0 or 1. The value F'=1, or F"=1, is here interpreted as the correct selection of the detector elements, the value F'=0, or F"=0, as an erroneous selection of the detector elements.

A further exemplary embodiment of a scale embodied in accordance with the invention, including the provided scanning of the same, will be explained in what follows by FIGS. 4, 5, as well as 6a to 6c.

Figure 4:
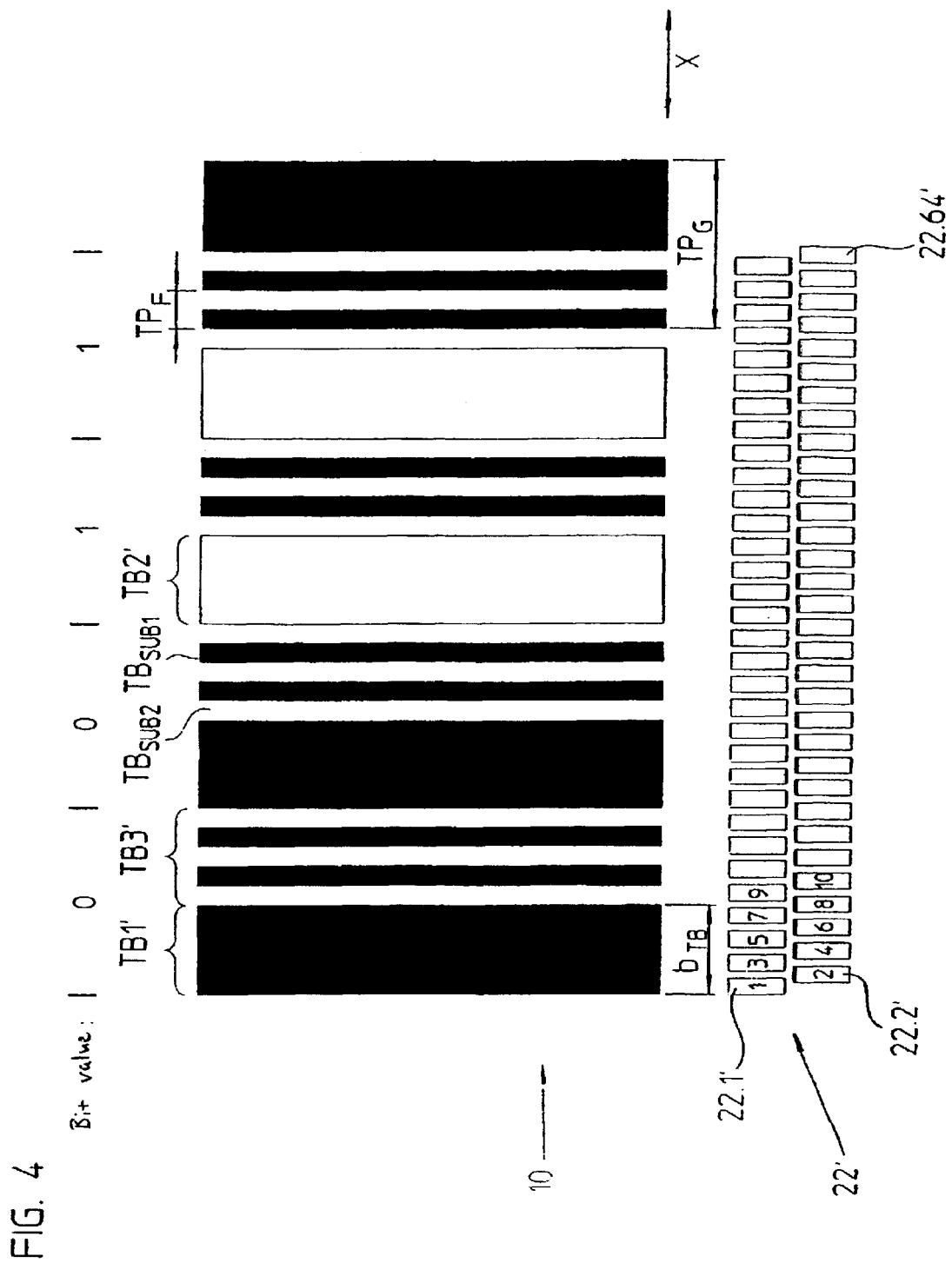
FIG. 4 is a view from above on a portion of a third embodiment of a scale in connection with a schematically indicated embodiment of a detector arrangement in accordance with the present invention.

A view from above on a portion of the scale 10', together with a schematically indicated detector arrangement 22', which can be employed in a linear transmitted light position measuring system, is represented in FIG. 4 analogously to the above described drawing figure. In accordance with the present invention, again three graduation areas TB1', TB2', TB3' with different optical properties are arranged along the measuring direction x on the side of the scale. As in the previously explained example, the first and second graduation areas TB1', TB2' are embodied to be completely opaque, or completely transparent.

The embodiment of the third graduation area TB3' on the one hand, and on the other hand the fact, that now the third graduation areas TB3' are periodically arranged along the scale 10' in the measuring direction x, are different from the above exemplary embodiment. In this example, the third graduation areas TB3' have a periodic sub-graduation, which also includes first and second sub-graduation areas $TB_{SUB1}$, $TB_{SUB2}$ with different optical properties, periodically arranged in the measuring direction x. In the example represented, the first and second sub-graduation areas $TB_{SUB1}$, $TB_{SUB2}$ are embodied opaque and completely transparent. The periods of the arrangement of the first and second sub-graduation areas $TB_{SUB1}$, $TB_{SUB2}$ will be called fine graduation periods $TP_F$ and define the extension of successive first and second sub-graduation areas $TB_{SUB1}$, $TB_{SUB2}$ in the measuring direction x. Besides the generation of a rough incremental signal $INC_G$ analogous to the previous example, because of the selected embodiment of the third graduation areas TB3' this variation of a scale 10' in accordance with the present invention permits the generation of a fine incremental signal $INC_F$, whose resolution is higher than that of the rough incremental signal $INC_G$. Therefore forming the absolute position value $POS_{ABS}$ with a further increased accuracy is possible.

In the case of this example, a so-called single field scanning furthermore results, together with certain dimension measures on the scanning side to be explained later, in the course of the generation of the different incremental signals $INC_G$, $INC_F$. This is to be understood as scanning wherein all phase-shifted signal portions of the incremental signals $TNC_G$, or $INC_F$ are the result of the scanning of a single graduation period $TP_G$, or $TP_F$ on the scale 10'. The insensitivity to local soiling of the scale is to be considered as a decisive advantage of such scanning, since in that case all generated phase-shifted partial signals which contribute to the different incremental signals $INC_G$, $INC_F$ are evenly affected.

In principle, the following equation (2) regarding the ratio of rough graduation period $TP_G$ and fine graduation period $TP_F$ on the part of the scale 10' should be followed:

$$TP_F = 1/n * \frac{1}{2} * TP_G \quad \text{Eq. (2)}$$

wherein n=1, 2, 3, ...

Besides the generation of an absolute position signal ABS, the scale in accordance with the present invention, together with certain steps on the scanning side which will be explained later, permits the generation of a rough incremental signal $INC_G$, as well as a fine incremental signal $INC_F$, as already mentioned. For the sake of simplicity, in what follows one rough, or one fine incremental signal $INC_G$, or $INC_F$ will always be mentioned, even though in actual use a pair of such signals is customarily generated, which have a phase offset of 90° with respect to each other.

As in the previous example, the rough incremental signals $INC_G$ are the result of the scanning of the graduation areas TB3' on the scale 10', which are periodically arranged with the rough graduation period $TP_G$, wherein in this case the third graduation areas TB3' are now arranged appropriately periodically. The fine incremental signal $INC_F$ is generated by scanning the sub-graduation structure in the third graduation area TB3', where a periodic arrangement of subgraduation areas of the fine graduation period $TP_F$ is present.

Thus, besides the absolute position signal ABS, in this variation two incremental signals $INC_G$, $INC_F$ of different resolution are available for further processing and the formation of an absolute position value $POS_{ABS}$ of high resolution. In the case of an example of a rough graduation period TPG=160 μm, as well as a fine graduation period $TP_F$=20 μm, selected on the part of the scale 10', rough incremental signals $INC_G$ of a signal period $SP_G$=160 μm, and fine incremental signals $INC_F$ of a signal period $SP_F$=20 μm result with appropriate scanning. Therefore, in this example the value n from Eq. (2) has been selected as n=4.

For generating the different scanning signals ABS, $INC_F$ and $INC_G$ on the part of the scanning unit, in particular together with the embodiment, or dimensioning of the detector arrangement 22', definite steps are required in the position measuring system of the invention, which will be explained in what follows.

As can be seen in FIG. 4, the detector arrangement 22' employed in this example includes a total of k=64 individual detector elements 22.1' to 22.64', which are periodically arranged in the measuring direction x.

To assure the mentioned single field scanning in this example, a total N=16 detector elements is arranged on the detector side per rough graduation period $TP_G$. In the general case of desired single field scanning, in which four incremental signals, which are phase-shifted by 90°, are to be generated per scanned graduation period, in accordance with the following equation it is necessary to arrange $$N = 4*n \quad \text{Eq. (3)}$$

wherein n=2, 3 ..., detector elements per rough graduation period $TP_G$ on the scanning side, if the ratio of the rough and fine graduation periods was selected in accordance with Eq. (2). Such dimensioning assures single field scanning in the course of generating the fine incremental signals $INC_F$, as well as in the course of generating the rough incremental signals $INC_G$.

For assuring single field scanning in the course of the intended generation of four phase-shifted scanning signals from a single graduation period, it is therefore basically necessary to arrange at least four detector elements per graduation period. This means that in the case of the sole generation of a rough incremental signal $INC_G$ in accordance with the above example at least four detector elements per rough graduation period $TP_G$, or a whole number multiple thereof, must therefore be arranged. In case of an additional generation of a fine incremental signal $INC_F$ it must be assured analogously to this that at least four detector elements, or possibly a whole number multiple thereof, per fine graduation period $TP_F$ are arranged.

Figure 5:
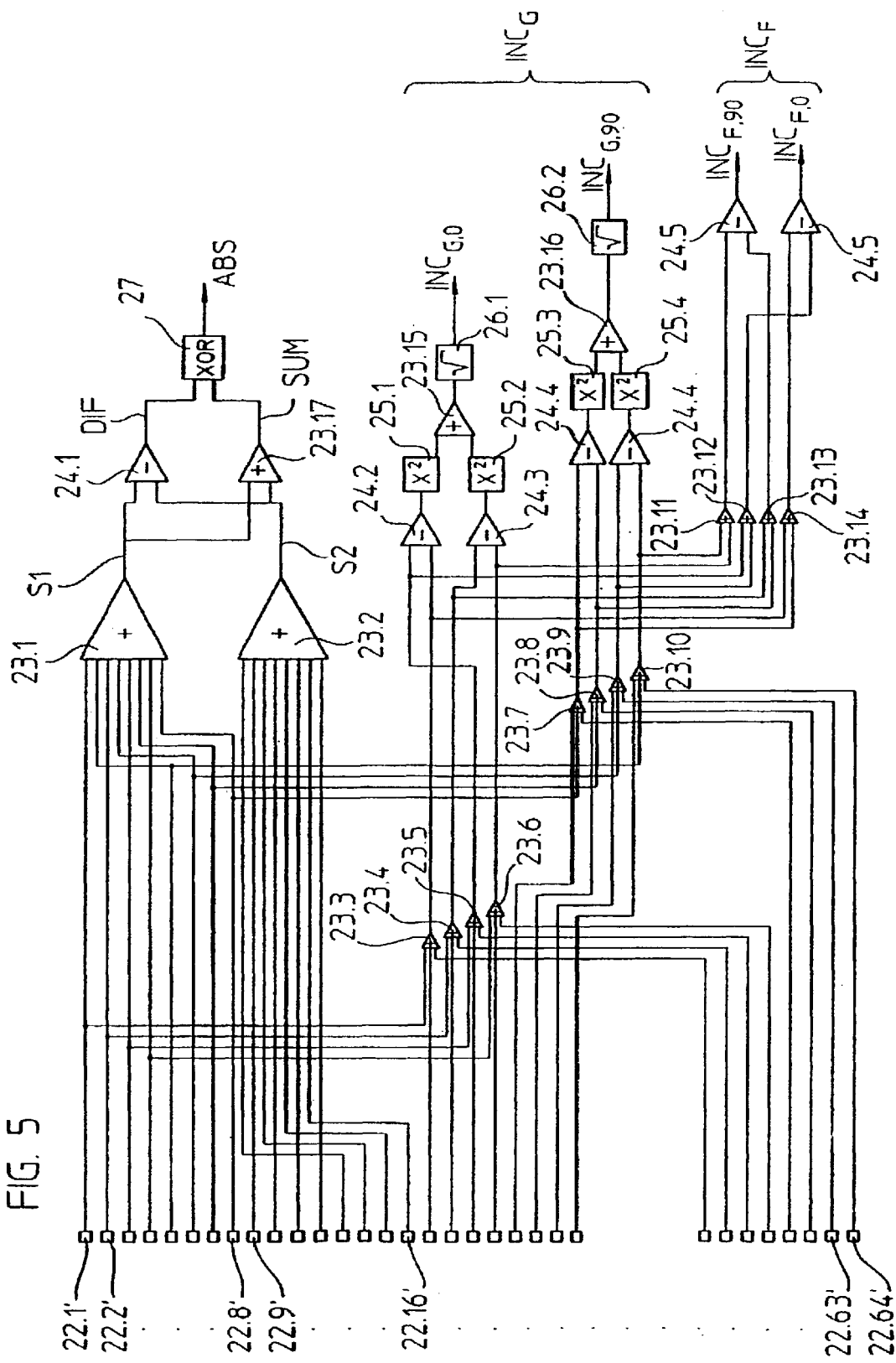
FIG. 5 is a block circuit diagram of an embodiment of a circuit to explain the processing of the signals generated by the detector arrangement in FIG. 4 in accordance with the present invention.

The interconnection of the detector elements 22.1' to 22.64', which are intended for generating the different scanning signals ABS, $INC_G$ and $INC_F$, within the detector arrangement 22' from the example of FIG. 4 is illustrated in FIG. 5. For reasons of clarity, only a portion of the k=64 detector elements 22.1' to 22.64' used for the signal generation is represented.

As already mentioned above, in actual use respectively one pair of phase-shifted rough incremental signals $INC_{G,0}$, $INC_{G,90}$, and fine incremental signals $INC_{F,0}$, $INC_{F,90}$ results which, for the sake of simplicity, so far have been called rough incremental signals $INC_G$, or fine incremental signals $INC_F$.

In the wiring diagram in FIG. 5, adding elements are identified by the reference symbols 23.1 to 23.17, which perform the adding of the respective signals present at the input. A subtraction, or formation of a difference, of the signals present at the input takes place by difference-forming elements identified by the reference symbols 24.1 to 24.5. The respectively mentioned arithmetic operation with the present input signals takes place with the aid of elements identified by the reference symbols 25.1 to 25.5, or 26.1, 26.2.

At least 16 detector elements, for example the detector elements 22.1' to 22.16', and the corresponding interconnections thereof are required in the present example for generating the different scanning signals ABS, $INC_G$ and $INC_F$. In the example the additionally provided second to fourth blocks, each with 16 further detector elements 22.17' to 22.32', 22.3' to 22.48' and 22.49' to 22.64', basically provide the identical scanning information and merely improve the resulting signal strength during scanning. This means that every sixteenth detector element provides equiphased scanning information.

The generation of the absolute position signal ABS in the present example will be explained in what follows. Again, the generation of the two logical signals ZERO (0) and ONE (1) is based on defined assignment rules. Defined signal levels are again assigned to the different graduation areas TB1' to TB3' in accordance with:

TB1': Signal level 0

TB2': Signal level 1

TB3': Signal level 0.5

Again, logical signals ZERO (0) and ONE (1) are assigned to defined, predetermined combinations of two signal levels following each other in the measuring direction x, wherein the following assignments apply in this example:

Signal level 0 to signal level 0.5 => logical signal ZERO (0) (TB1' to TB3')

Signal level 1 to signal level 0.5 => logical signal ONE (1) (TB2' to TB3')

In order to decide with this variation of a scale in accordance with the invention whether the detector elements have been correctly selected, the formation of a sum signal SUM from the signals of adjoining graduation areas is performed in addition, besides the formation of a difference signal DIF from the signals of adjoining graduation areas. The resulting difference and sum signals are assigned to the two logical signals ZERO (0) and ONE (1) in accordance with the following assignment instructions:

Difference signal DIF=+0.5=>logical signal ONE (1)
Difference signal DIF=−0.5=>logical signal ZERO (0)
Sum signal SUM=+1.5=>logical signal ONE (1)
Sum signal SUM=+0.5=>logical signal ZERO (0)

In the example of successive first and third graduation areas TB1', TB3', the difference signal DIF=−0.5 and the sum signal SUM=+0.5 result. In accordance with the above instructions, the logical signal ZERO (0) is assigned to both signals, i.e. the selection of the detector elements is correct. In the case of successive third and first graduation areas TB3'. TB1', however, the difference signal DF=+0.5 and the sum signal SUM=+0.5 would result. In accordance with the above instructions for the assignment of sum and difference signals this would mean the assignment of the logical signal ONE (1) to the difference signal DIF and the assignment of the logical signal ZERO (0) to the sum signal SUM. It is then possible to assume a possibly incorrect selection of the detector elements on the basis of this discrepancy. The same as in the previous example, it is therefore possible to determine from the scanning of the scale of the present invention whether or not the detector elements had been correctly selected.

For the conversion in accordance with circuit engineering, the resulting scanning signals from the first eight detector elements 22.1' to 22.8' are added in this example via the adding element 23.1 into the signal S1, the scanning signals from the second eight detector elements 22.9' to 22.16' via the second adding element 23.2 into the signal S2. Thereafter the difference signal DIF is formed from the added-up signals S1, S2 with the aid of the difference-forming element 24.1, and with the aid of the adding element 23.17 the sum signal SUM. Subsequently the sum signal SUM and the difference signal are fed to a linkage element 27, in which an XOR linkage of the signals DIF and SUM takes place in accordance with the previously explained assignment instructions. The absolute position signal ABS, which can be further processed, or the corresponding bit values or logical signals, are then present at the output of the linkage element 27.

An interconnection of the detector elements in the manner represented in FIG. 5 is provided for generating the rough incremental signal $INC_G$, or the pair of phase-shifted rough incremental signals $INC_{G,0}$, $INC_{G,90}$. With respect to the selected interconnection variation it should only be noted here that the selection of the detector elements to be interconnected takes place in a known manner as a function of the rough graduation period TPG on the scale.

Also, in connection with the generation of the fine incremental signal $INC_F$, or the pair of phase-shifted fine incremental signals $INC_{F,0}$, $NC_{F,90}$, reference is only made to the interconnection of the detector elements in the way represented in FIG. 4. Here, too, the selection of the detector elements to be interconnected is a function of the fine graduation period $TP_F$ on the scale.

Figure 6A:
FIGS. 6a to 6c show the signals generated from the scale area represented in FIG. 4.
Figure 6B:
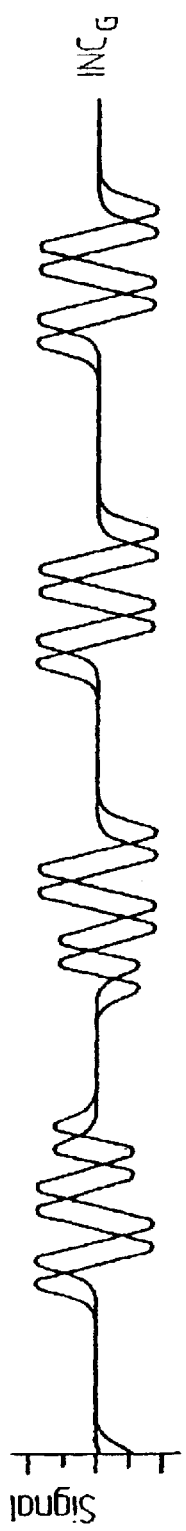
Figure 6C:
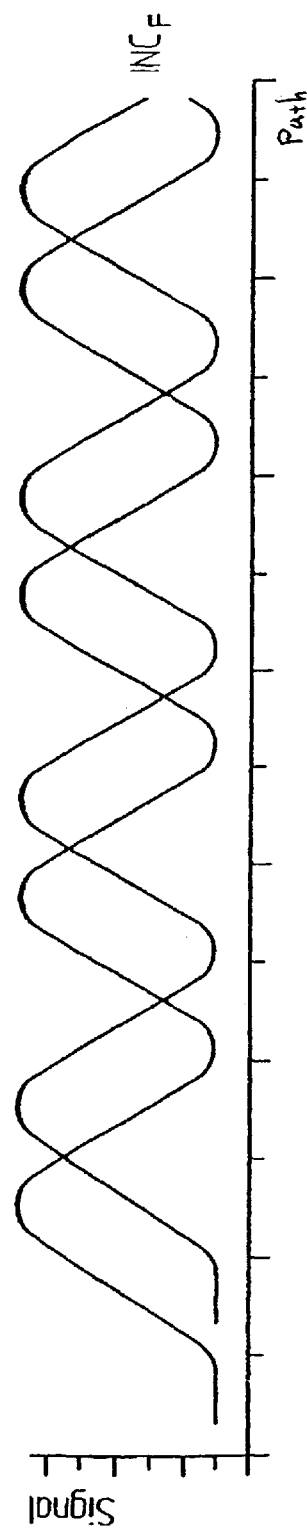

The scanning signals ABS, $INC_G$ and $INC_F$, or the corresponding pairs of signals $INC_{F,0}$, $INC_{F,90}$, ABS, $INC_{G,0}$, $INC_{G,90}$ resulting from such an interconnection of the detector elements 22.1'–22.64' are represented in FIGS. 6a to 6c.

A great variety of modifications in comparison with the variations so far explained is of course possible within the scope of the present invention.

For example, it would be possible to change the second explained exemplary embodiment in such a way that a scanning grating is arranged on the part of the scanning unit upstream of the detector arrangement, which is embodied as a phase grating, for example. It is possible by means of such a scanning grating to generate in a known manner a so-called Vernier beat on the scale in the detection plane, based on the resulting interaction with the fine graduation period. In turn, an incremental signal with a defined signal period can be derived from this Vernier beat.

It should furthermore be mentioned that it is of course also possible to vary the detector arrangement, in particular the number of the detector elements employed, within the scope of the above considerations.

Therefore further exemplary embodiments exist within the scope of the present invention besides the described examples.

It is therefore intended that the foregoing detailed description be regarded as illustrative rather than limiting, and that it be understood that it is the following claims, including all equivalents, that are intended to define the spirit and scope of this invention.

We claim:

1. A scale which is suitable for an absolute position determination, comprising:
    a track which extends in at least one measuring direction and in which graduation areas of identical width and different optical properties are alternatingly arranged;
    at least first, second and third graduation areas with different optical properties that are arranged in said track, wherein a first logical signal is unequivocally assigned to a first combination of two successive different graduation areas, and a second logical signal is unequivocally assigned to a second combination of two successive different graduation areas, and wherein said first and second combinations differ from each other.

2. The scale in accordance with claim 1, wherein either said first graduation area, said second graduation area or said third graduation area is arranged periodically in said measuring direction with a rough graduation period.

3. The scale in accordance with claim 2, wherein said first, second and third graduation areas have an identical width.

4. The scale in accordance with claim 3, wherein said rough graduation period corresponds to twice said width.

5. The scale in accordance with claim 2, wherein said first and second graduation areas have optical properties which are complementary to each other.

6. The scale in accordance with claim 1, wherein said first and second graduation areas have optical properties which are complementary to each other.

7. The scale in accordance with claim 6, wherein said third graduation area comprises an optical property which lies between optical properties of said first and second graduation areas.

8. The scale in accordance with claim 7, wherein said third graduation area is semi-transparent.

9. The scale in accordance with claim 6, wherein said third graduation area comprises a periodic sub-graduation with a fine graduation period, which comprises periodically arranged sub-graduation areas with different optical properties.

10. The scale in accordance with claim 9, wherein said sub-graduation areas comprise optical properties which are complementary to each other.

11. The scale in accordance with claim 9, wherein said fine graduation period is selected in accordance with the equation $$TP_F = 1/n * \frac{1}{2} * TP_G$$

wherein n=1, 2, 3 . . . and $TP_G$ represents said rough graduation period.

12. The scale in accordance with claim 6, wherein said optical properties that are complementary to each other are selected from the group consisting of transparency and reflectance.

13. The scale in accordance with claim 1, wherein said first logical signal is assigned to successive first and third graduation areas, and said second logical signal is assigned to successive second and third graduation areas.

14. The scale in accordance with claim 1, wherein a sequence of logical signals, which include said first and second logical signals, identifies an unequivocal absolute position along said measuring direction.

15. A position measuring system for absolute position determination, comprising:
   a scale comprising:
   a track which extends in at least one measuring direction and in which graduation areas of identical width and different optical properties are alternatingly arranged; and
   at least first, second and third graduation areas with different optical properties that are arranged in said track, wherein a first logical signal is unequivocally assigned to a first combination of two successive different graduation areas, and a second logical signal is unequivocally assigned to a second combination of two successive different graduation areas, and wherein said first and second combinations differ from each other; and
   a scanning unit, which is movable in relation to said scale in a measuring direction and determines an absolute position of said scanning unit in relation to said scale by scanning said scale.

16. The position measuring system in accordance with claim 15, wherein said scanning unit comprises:
   a light source; and
   a detector arrangement for scanning said scale, wherein said detector arrangement is used for generating an absolute position signal, as well as a rough incremental signal.

17. The position measuring system in accordance with claim 16, wherein said detector arrangement is furthermore used for generating a fine incremental signal.

18. The position measuring system in accordance with claim 16, wherein said scanning unit further comprises a scanning grating arranged upstream of said detector arrangement.

19. The position measuring system in accordance with claim 15, wherein said detector arrangement comprises an arrangement of individual detector elements, which are periodically arranged in said measuring direction.

20. The position measuring system in accordance with claim 19, wherein said arrangement of individual detector elements comprises at least four detector elements arranged in said measuring direction per a rough graduation period.

21. The position measuring system in accordance with claim 20, wherein said arrangement of individual detector elements comprise at least four individual detector elements arranged in said measuring direction per a fine graduation period.

* * * * *